US012242311B2

(12) United States Patent
Saito et al.

(10) Patent No.: US 12,242,311 B2
(45) Date of Patent: Mar. 4, 2025

(54) DISPLAY DEVICE

(71) Applicants: Yoshito Saito, Kanagawa (JP); Kohdai Asanuma, Kanagawa (JP)

(72) Inventors: Yoshito Saito, Kanagawa (JP); Kohdai Asanuma, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 127 days.

(21) Appl. No.: 18/166,629

(22) Filed: Feb. 9, 2023

(65) Prior Publication Data
US 2023/0280800 A1 Sep. 7, 2023

(30) Foreign Application Priority Data

Mar. 3, 2022 (JP) ................................. 2022-032718
May 26, 2022 (JP) ................................. 2022-086358

(51) Int. Cl.
*G06F 1/16* (2006.01)
*H05K 5/02* (2006.01)

(52) U.S. Cl.
CPC ............ *G06F 1/1683* (2013.01); *G06F 1/166* (2013.01); *H05K 5/0234* (2013.01); *H05K 5/0247* (2013.01); *G06F 1/1643* (2013.01); *G06F 1/1679* (2013.01)

(58) Field of Classification Search
CPC ...... G06F 1/166; G06F 1/1683; G06F 1/1626; H05K 5/0234; H05K 5/0247
See application file for complete search history.

(56) References Cited

U.S. PATENT DOCUMENTS

| | | | | |
|---|---|---|---|---|
| 10,835,106 | B1* | 11/2020 | Ubbesen | G06F 1/1626 |
| 10,860,066 | B1* | 12/2020 | Barnard | F16M 11/041 |
| 10,955,873 | B1* | 3/2021 | Godfrey | H05K 5/0234 |
| 11,489,326 | B1* | 11/2022 | Chung | H02G 11/00 |
| 11,991,846 | B2* | 5/2024 | Wallace | H01R 13/639 |
| 2004/0047115 | A1* | 3/2004 | Helot | F16M 11/2021 |
| | | | | 361/679.06 |
| 2007/0084621 | A1* | 4/2007 | Martin | G06F 1/1603 |
| | | | | 174/97 |
| 2010/0053875 | A1* | 3/2010 | Kurachi | G06F 1/166 |
| | | | | 361/679.21 |
| 2015/0055285 | A1* | 2/2015 | Zheng | G06F 1/1626 |
| | | | | 361/679.26 |

(Continued)

FOREIGN PATENT DOCUMENTS

| | | |
|---|---|---|
| JP | 2004-220440 | 8/2004 |
| JP | 2005-218289 | 8/2005 |

(Continued)

OTHER PUBLICATIONS

Extended European Search Report for 23158286.7 mailed on Aug. 10, 2023.

*Primary Examiner* — Nidhi Thaker
(74) *Attorney, Agent, or Firm* — IPUSA, PLLC

(57) ABSTRACT

A display device includes a thin portion, a thick portion, and an interface portion. The thin portion includes a display. The thick portion is disposed on a rear face of the thin portion thicker than the thin portion. The thick portion includes a recess. The interface portion connects to a connector of a cable for connection with an external device. The interface portion is disposed in the recess of the thick portion.

14 Claims, 17 Drawing Sheets

(56) References Cited

U.S. PATENT DOCUMENTS

| | | | | |
|---|---|---|---|---|
| 2015/0227177 A1* | 8/2015 | McKean | ............... | G06F 1/1656 |
| | | | | 361/679.4 |
| 2019/0289265 A1 | 9/2019 | Saito | | |
| 2021/0120689 A1* | 4/2021 | Kim | ....................... | F16M 11/22 |
| 2023/0280800 A1* | 9/2023 | Saito | ..................... | G06F 1/1643 |
| | | | | 361/679.01 |

FOREIGN PATENT DOCUMENTS

| | | |
|---|---|---|
| JP | 2007-272916 | 10/2007 |
| JP | 2011-160384 | 8/2011 |
| JP | 2013-105022 | 5/2013 |
| JP | 2014-153534 | 8/2014 |
| JP | 2015-032064 | 2/2015 |
| JP | 2020-198574 | 12/2020 |
| WO | WO2011/021233 A1 | 2/2011 |
| WO | 2021/165366 | 8/2021 |

* cited by examiner

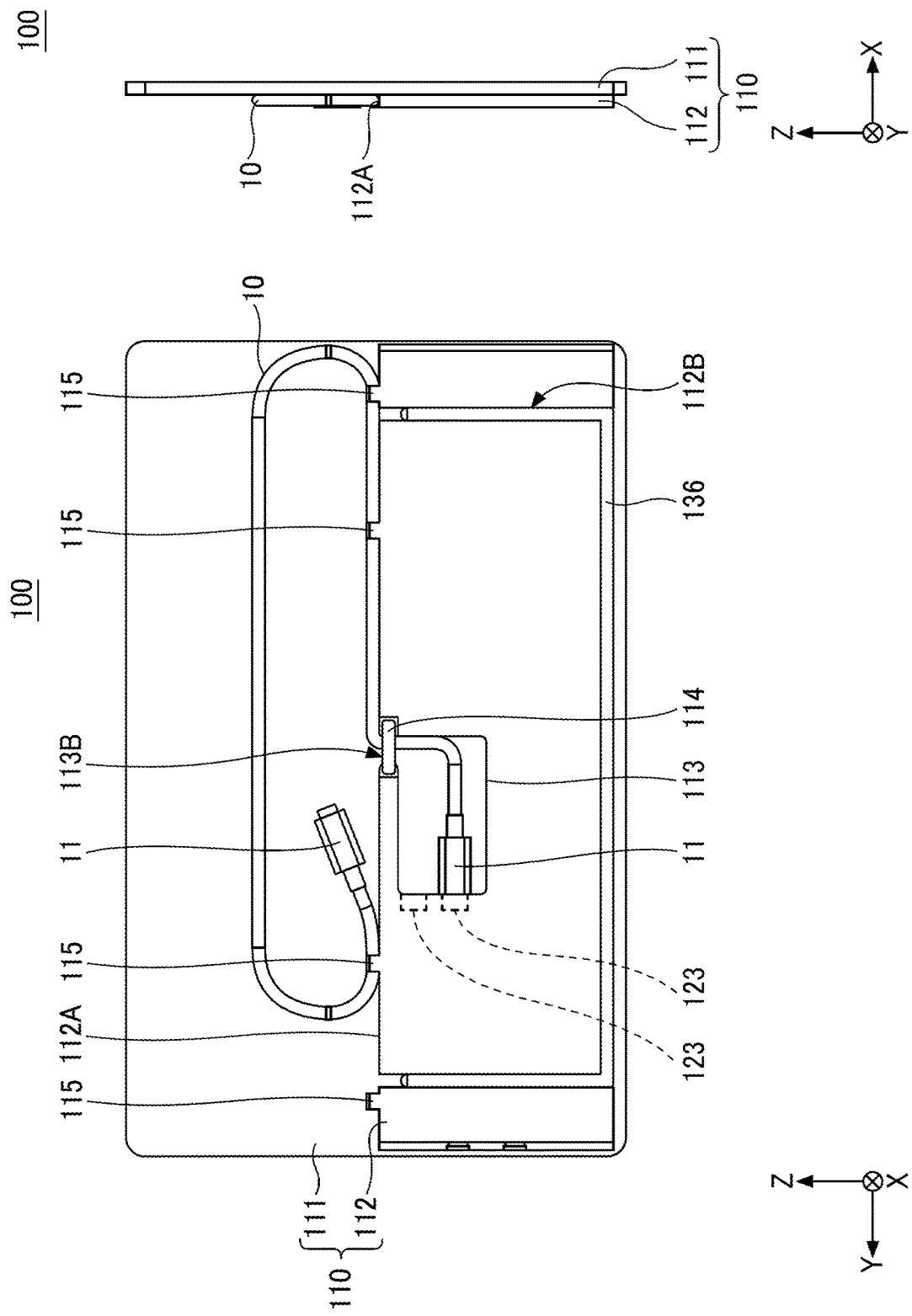

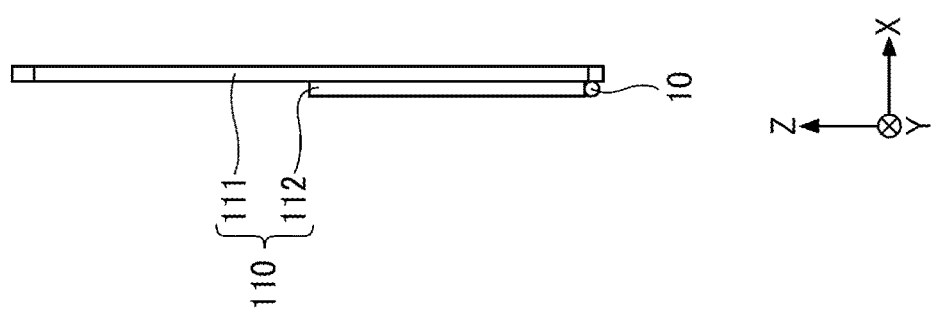
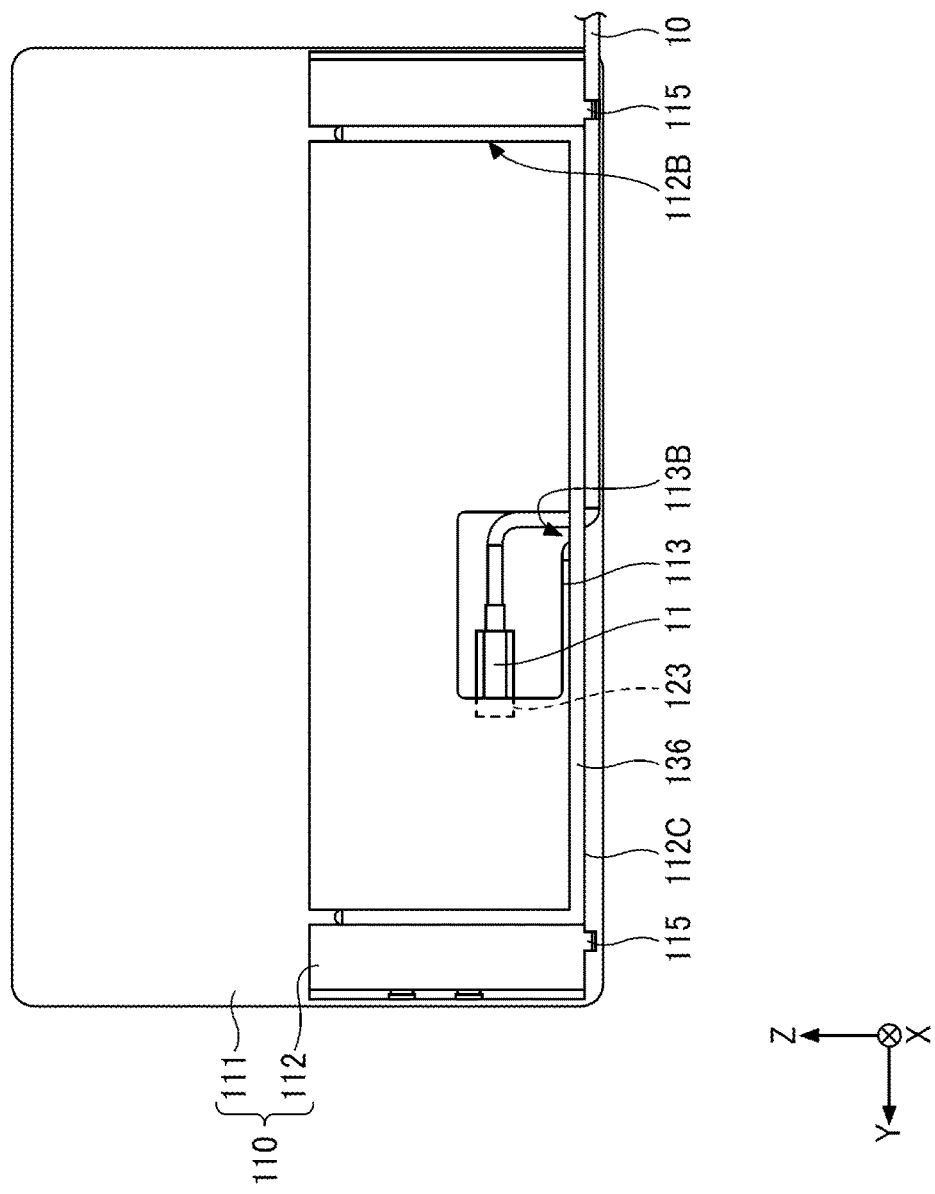

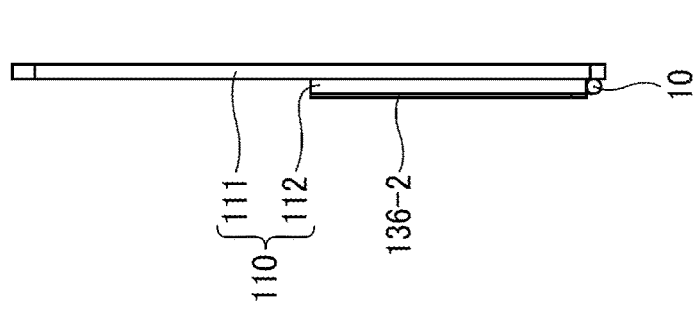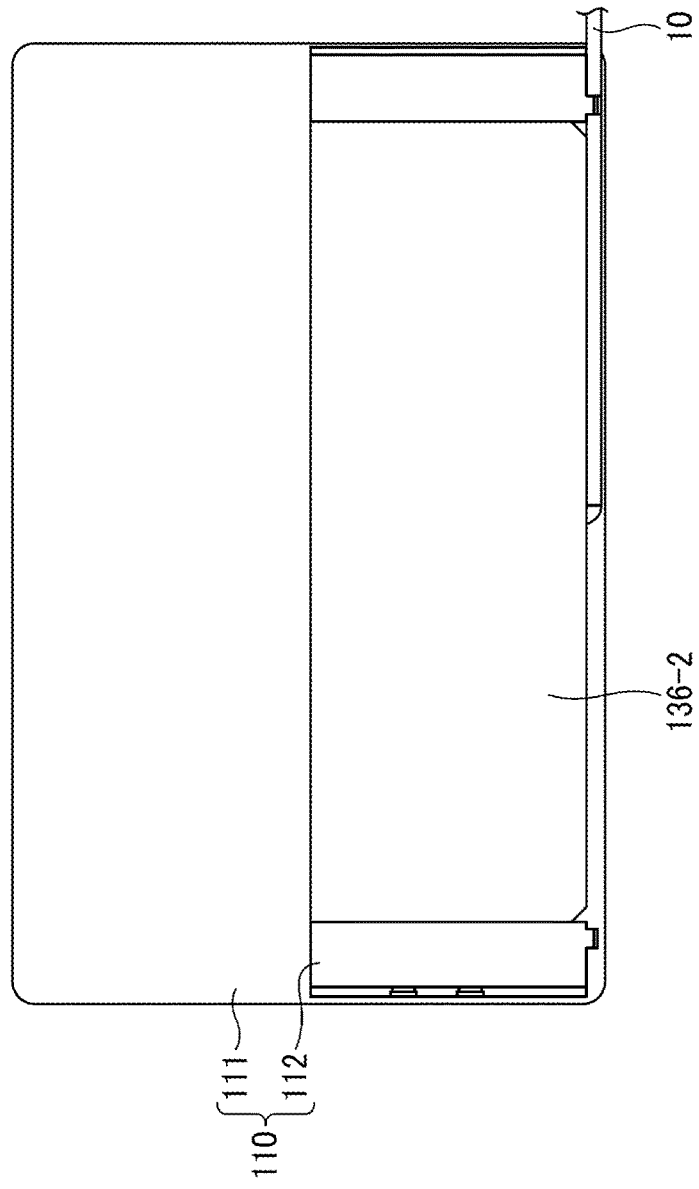

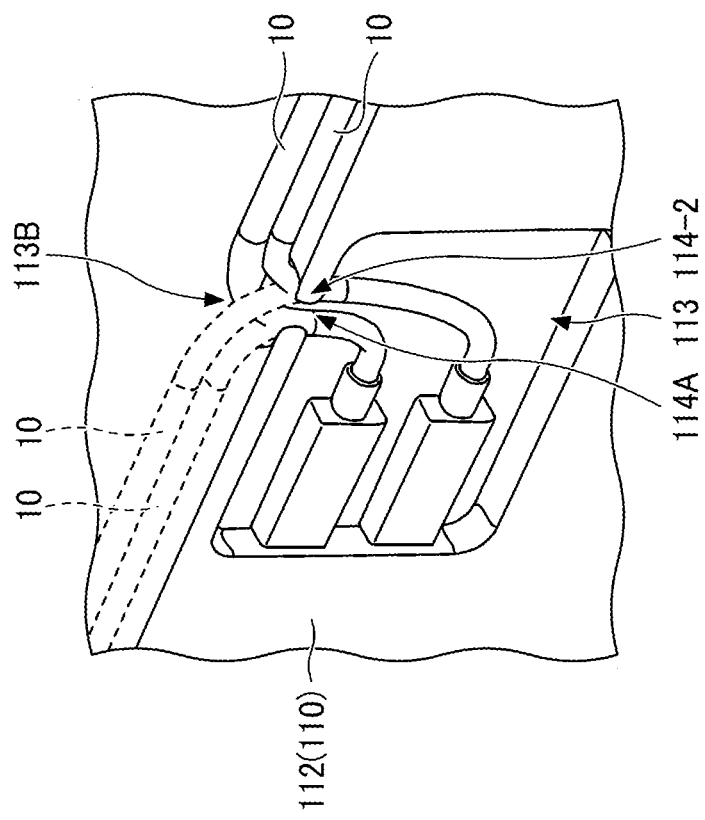
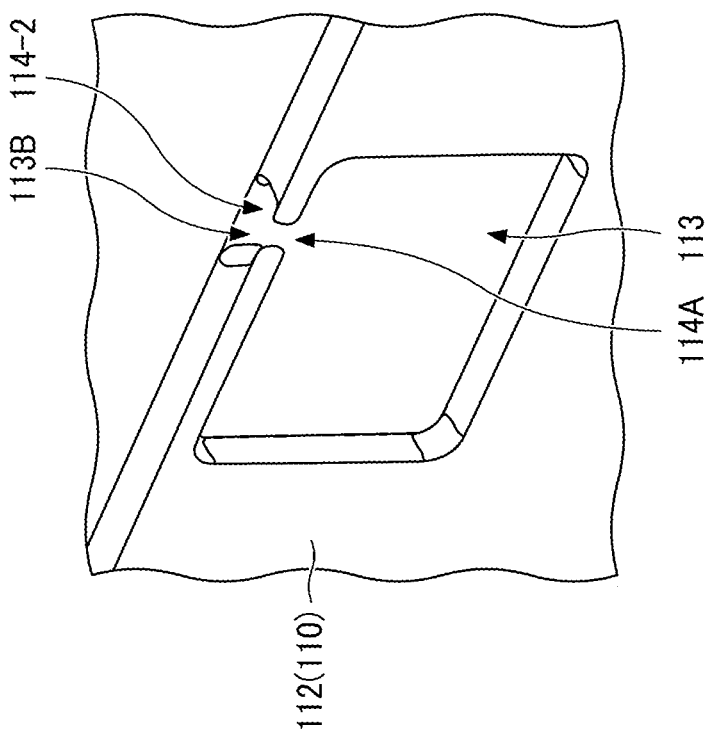

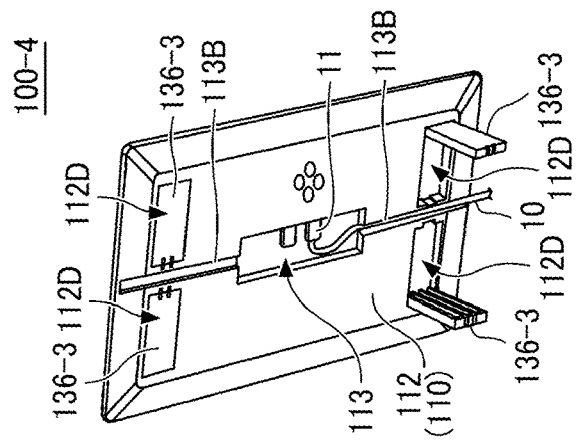
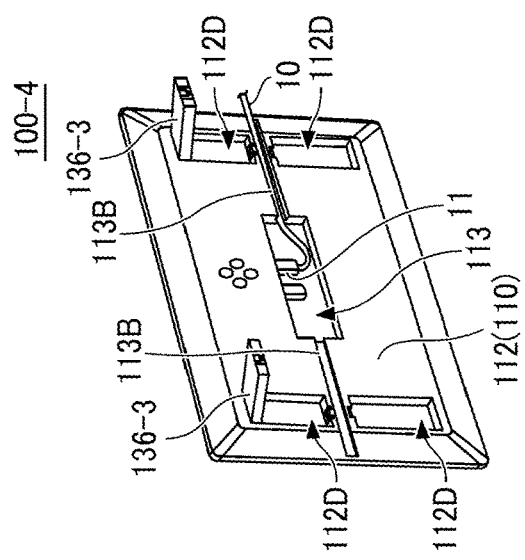
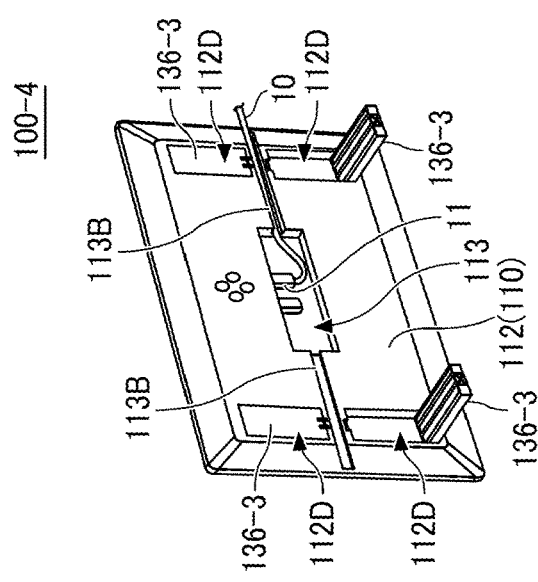

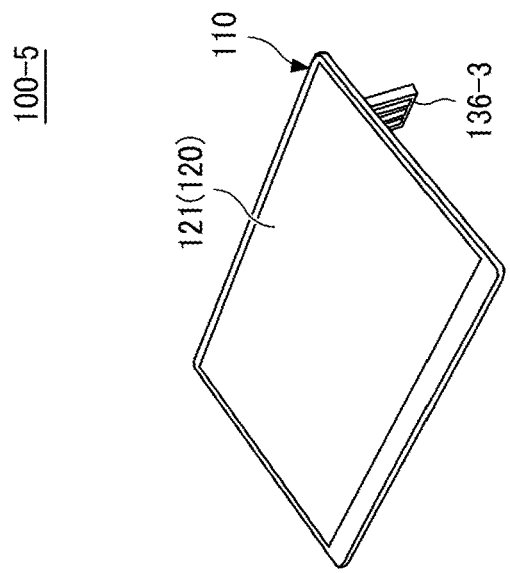
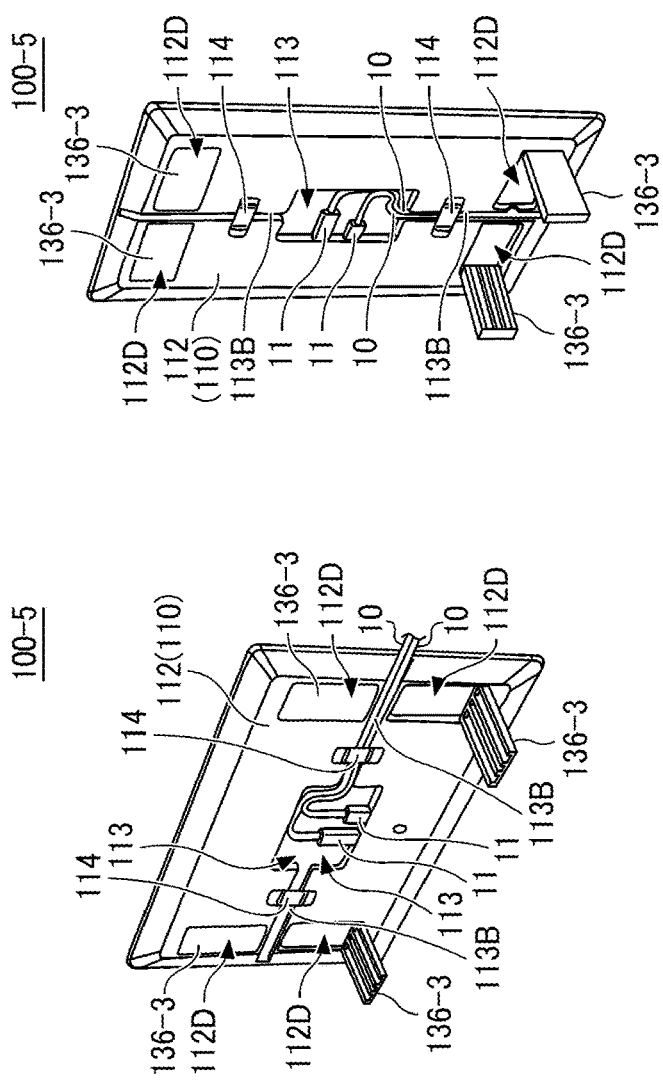

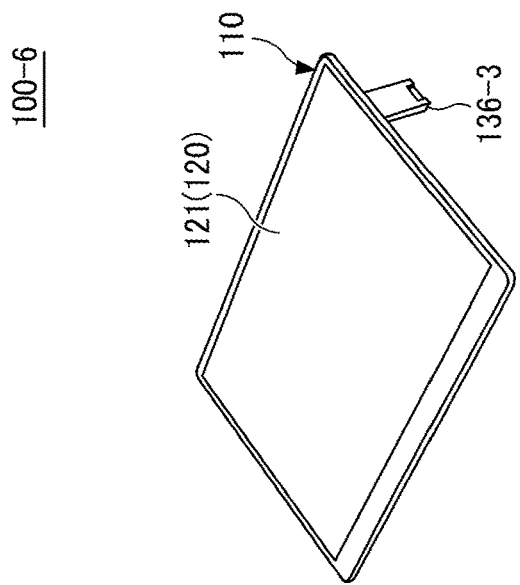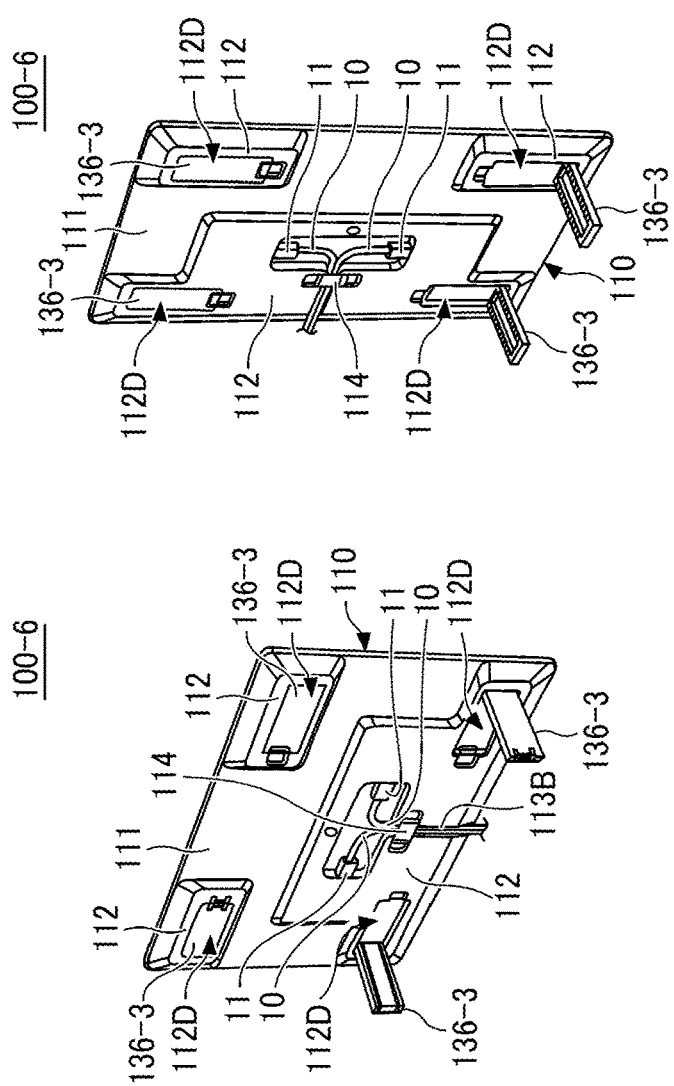

DISPLAY DEVICE

CROSS-REFERENCE TO RELATED APPLICATIONS

This patent application is based on and claims priority pursuant to 35 U.S.C. § 119(a) to Japanese Patent Application No. 2022-032718, filed on Mar. 3, 2022, and No. 2022-086358, filed on May 26, 2022, in the Japan Patent Office, the entire disclosure of each of which is hereby incorporated by reference herein.

BACKGROUND

Technical Field

Embodiments of the present disclosure relate to a display device.

Related Art

A technique is known in which a connection terminal portion to which a cable is connected is provided on a side face of a housing of a display device.

SUMMARY

Embodiments of the present disclosure described herein provide a novel display device including a thin portion, a thick portion, and an interface portion. The thin portion includes a display. The thick portion is disposed on a rear face of the thin portion thicker than the thin portion. The thick portion includes a recess. The interface portion connects to a connector of a cable for connection with an external device. The interface portion is disposed in the recess of the thick portion.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIG. 4A is a rear view of the display device when the display device is not used according to the first embodiment of the present disclosure;

FIG. 4B is a side view of the display device when the display device is not used according to the first embodiment of the present disclosure;

FIG. 7A is a rear view of the display device according to the second embodiment of the present disclosure;

FIG. 7B is a side view of the display device according to the second embodiment of the present disclosure;

FIG. 10A is a rear view of the display device according to the third embodiment of the present disclosure;

FIG. 10B is a side view of the display device according to the third embodiment of the present disclosure;

FIGS. 11A and 11B are views illustrating a modification of a holder included in the display device according to an embodiment of the present disclosure;

FIGS. 12A, 12B, and 12C are views illustrating an example of a first modification of a configuration of the rear side of the display device according to an embodiment of the present disclosure;

FIGS. 13A, 13B, and 13C are views illustrating an example of a second modification of a configuration of the rear side of the display device according to an embodiment of the present disclosure;

FIGS. 14A, 14B, and 14C are views illustrating an example of a third modification of a configuration of the rear side of the display device according to an embodiment of the present disclosure;

Figure 1:
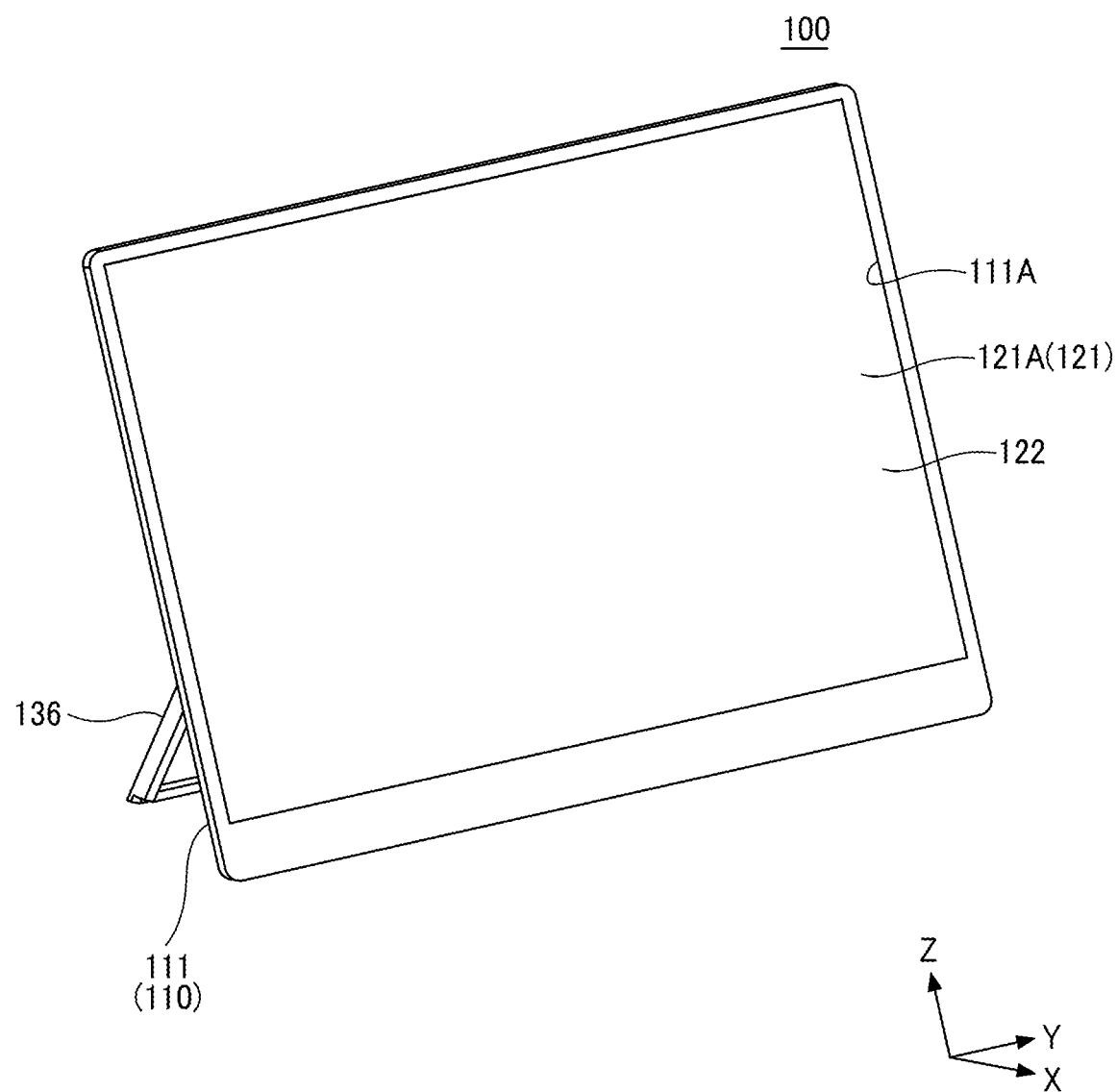
FIG. 1 is an external perspective view illustrating a front side of a display device according to a first embodiment of the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

Descriptions are given of an example applicable to embodiments of the present disclosure.

First Embodiment Configuration of Display Device 100

Figure 2:
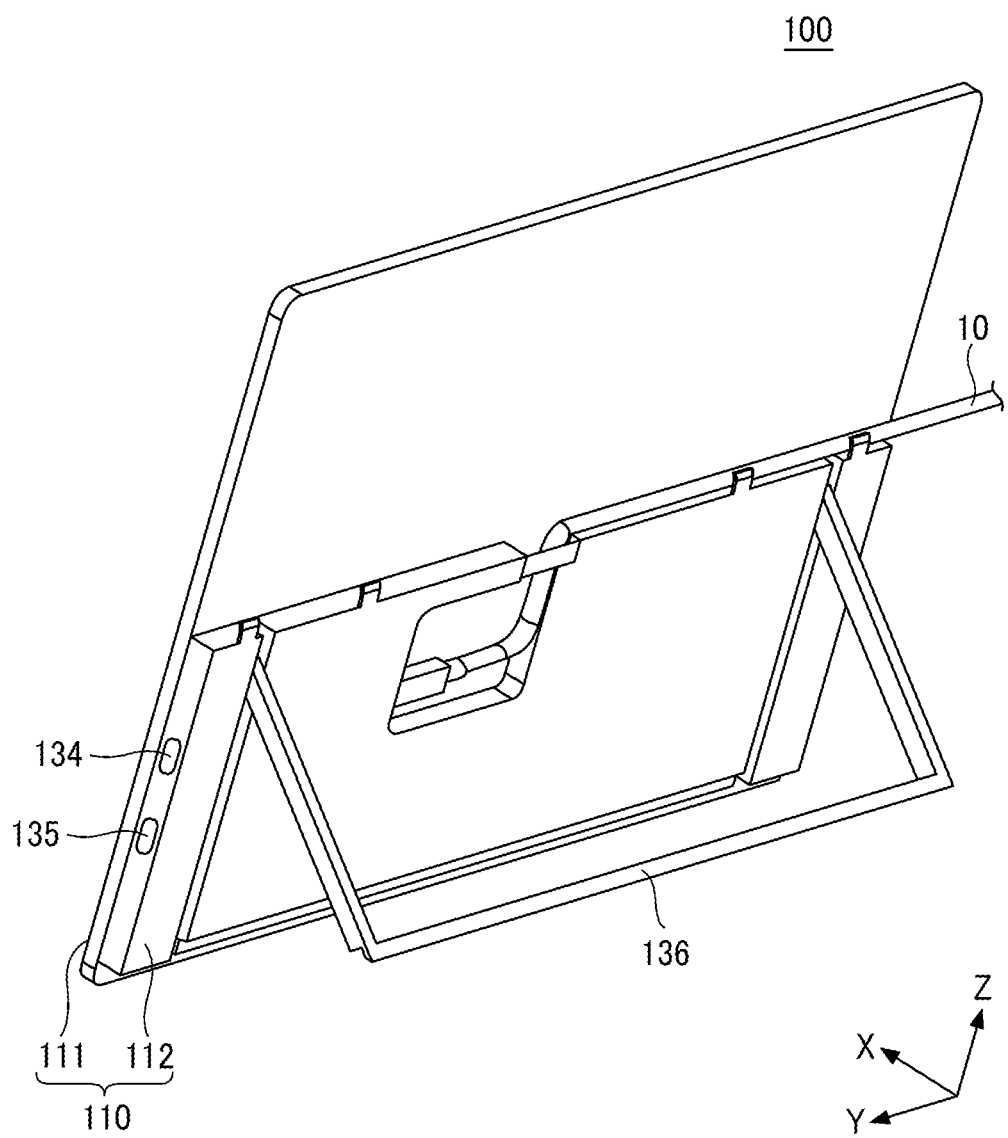
FIG. 2 is an external perspective view illustrating a rear side of the display device according to the first embodiment of the present disclosure.

FIG. 1 is an external perspective view illustrating a front side of a display device 100 according to a first embodiment of the present disclosure. FIG. 2 is an external perspective view illustrating a rear side of the display device 100 according to the first embodiment of the present disclosure.

In the following description, a direction corresponding to the vertical direction of a display 121 is referred to as an up-down direction (Z-axis direction). In addition, a direction corresponding to the horizontal direction of the display 121 is referred to as a width direction or a left-right direction (Y-axis direction). Further, a direction corresponding to the depth direction of the display 121 is referred to as a back-and-forth direction (X-axis direction).

Note that a direction (Y-axis positive direction) on the left side when viewed from the rear side (X-axis negative side) of the display is referred to as a left direction, and a direction (Y-axis negative direction) on the right side when viewed from the rear side (X-axis negative side) of the display is referred to as a right direction.

The display device 100 illustrated in FIGS. 1 and 2 includes a screen 121A of the display 121 on the front face (face on the positive side of the X-axis). The display device 100 is connected to an external device (e.g., a laptop computer, a smartphone, or an electric power source such as alternating current (AC) adapter) via a cable 10 and can display various images (moving images or still images) transmitted from the external device via the cable 10 on the screen 121A of the display 121. In other words, the display device 100 is a relatively thin display device having a built-in battery and portability. The display device 100 can be carried together with the external device and connected to the external device at the time of use. In other words, the display device 100 can be used as an extended display device of an external device.

As illustrated in FIGS. 1 and 2, the display device 100 includes a housing 110 that forms the outer shape of the display device 100. The housing 110 is made of resin and has a hollow structure. The housing 110 includes a thin portion 111 and a thick portion 112.

The thin portion 111 is a plate-shaped portion constituting the front side (Z-axis positive side) of the housing 110. The thin portion 111 has a horizontally long rectangular shape in a plan view from the front side (X-axis positive direction) or the rear side (X-axis negative direction). The thin portion 111 is a portion having a relatively thin thickness in the depth direction (X-axis direction). The thin portion 111 includes the display 121. A rectangular opening 111A is formed in a front face (face on the positive side of the X-axis) of the thin portion 111, and a screen 121A of the display 121 exposes from the opening 111A. The display 121 is, for example, an organic electro-luminescence (EL) display or a liquid crystal display.

In the thin portion 111, a touch sensor 122 is overlaid on the screen 121A of the display 121. The touch sensor 122 receives various input operations, for example, a selection operation and a handwriting input operation. As the touch sensor 122, for example, a capacitive touch panel can be used.

Figure 5:
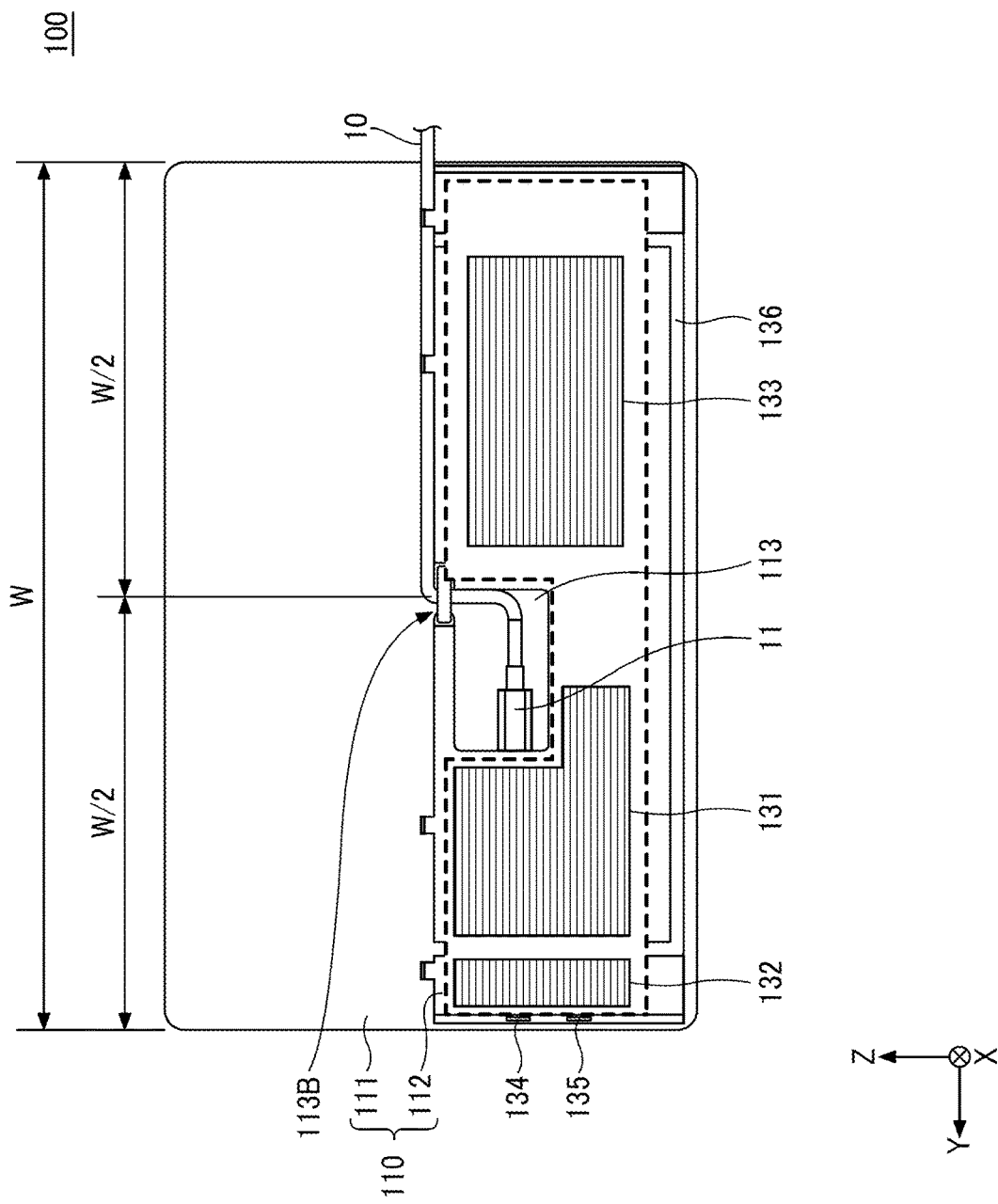
FIG. 5 is a view illustrating an example of an internal configuration of the display device according to the first embodiment of the present disclosure.

The thick portion 112 is a plate-shaped portion constituting the rear side (X-axis negative side) of the housing 110 and is provided such that the thick portion 112 protrudes backward from a lower portion of the rear face of thin portion 111. The thick portion 112 is a portion having a relatively large thickness in the depth direction (X-axis direction). The thick portion 112 has a horizontally long rectangular shape in a plan view from the rear side (X-axis negative direction). The thick portion 112 has a vertical width and a horizontal width such that the thick portion 112 does not protrude from the thin portion 111 in a plan view from the rear side (X-axis negative direction). As illustrated in FIG. 5, the thick portion 112 includes a control board 131, an operation board 132, and a battery 133. As illustrated in FIG. 3, an interface portion 123 to which a connector 11 of the cable 10 is connected is provided on the rear face of the thick portion 112.

Configuration of Rear Face of Display Device 100

Figure 3B:
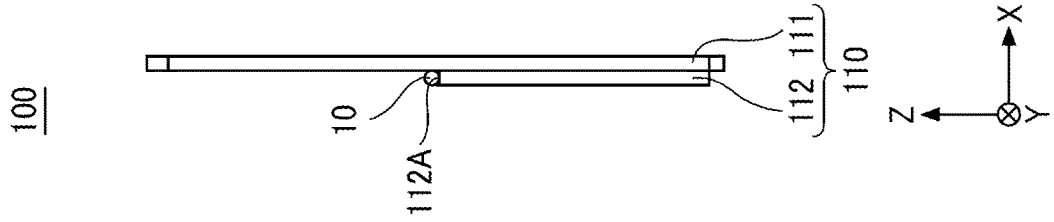
FIG. 3B is a side view of the display device when the display device is in use, according to the first embodiment of the present disclosure.
Figure 3A:
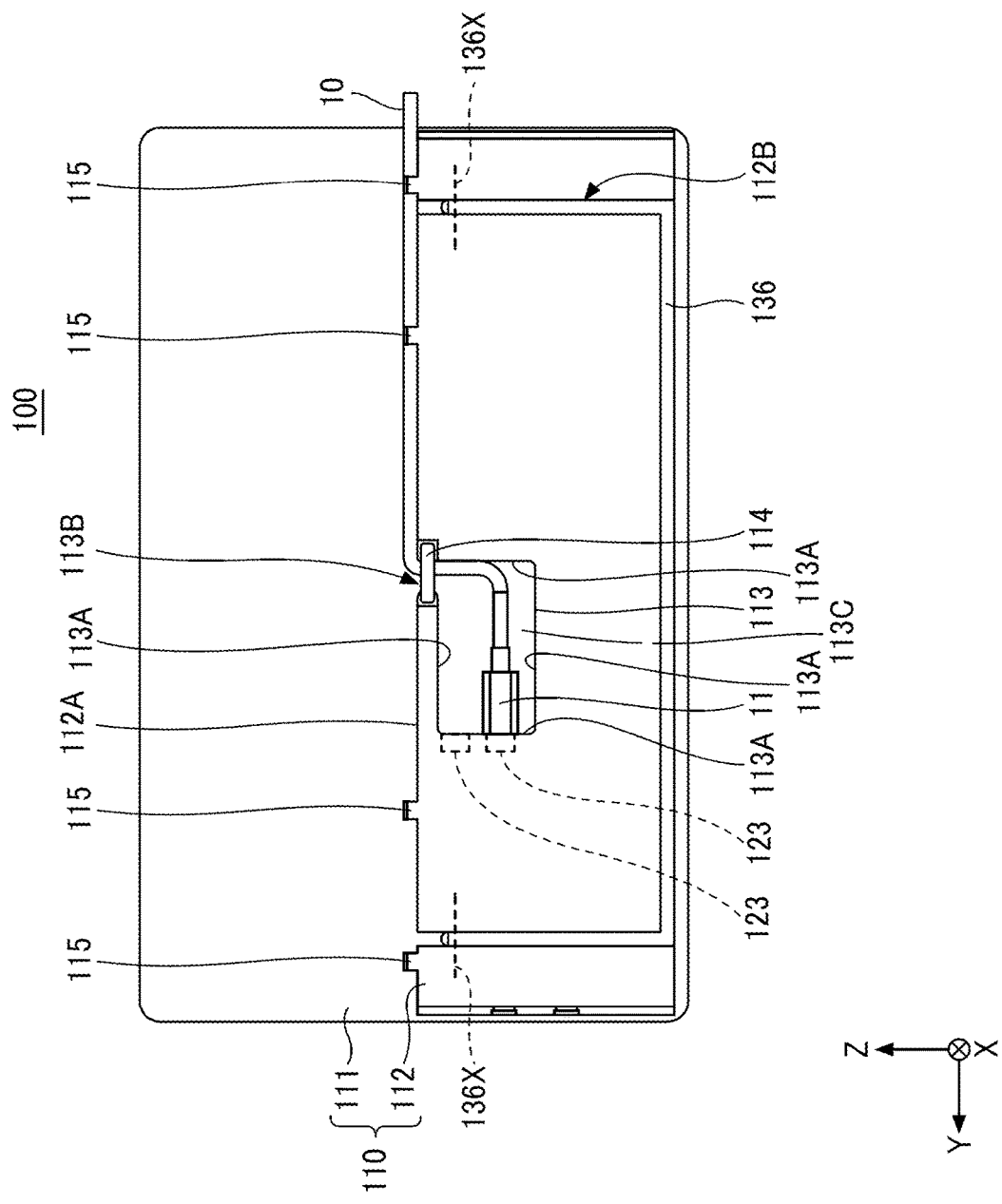
FIG. 3A is a rear view of the display device when the display device is in use, according to the first embodiment of the present disclosure.

FIGS. 3A and 3B are a rear view and a side view, respectively, of the display device 100 when the display device is in use, according to a first embodiment of the present disclosure.

As illustrated in FIG. 3A, a recess 113 is formed on the rear face of the thick portion 112 of the housing 110. The recess 113 is a portion recessed forward (X-axis positive direction) having a certain depth. In the example illustrated in FIG. 3A, the recess 113 has a rectangular shape in a plan view from the rear side, but the shape of the recess 113 is not limited to a rectangular shape. The concave portion 113 includes a plurality of walls 113A extending in the thickness direction of the thick portion 112 and a bottom portion 113C parallel to a direction intersecting the walls 113A.

As illustrated in FIG. 3A, the interface portions 123 expose in the recess 113 of the thick portion 112. In the example illustrated in FIG. 3A, the interface portions 123 are disposed in the recess 113 to expose from the wall 113A on the Y-axis positive side of the recess 113 of the thick portion 112.

Accordingly, in the display device 100 according to the first embodiment as illustrated in FIG. 3A, the connector 11 provided at one end of the cable 10 can be connected to the interface portion 123 in a state of being disposed in the recess 113.

In other words, in the display device 100 according to the first embodiment, the connector 11 of the cable 10 can be connected to the interface portion 123 without protruding from the side of the housing 110.

As a result, according to the display device 100 of the first embodiment, the display device 100 and the external device can be arranged directly next to each other.

Further, since the display device 100 of the first embodiment can prevent a sudden load from being applied to the connector 11 of the cable 10, the risk of damaging the interface portion 123 can be reduced.

The cable 10 may be, for example, a universal serial bus (USB) cable and a high-definition multimedia Interface® (HDMI) cable. The interface portion 123 has a shape fitting into the connector 11 of the cable 10.

The depth of the recess 113 (depth in the X-axis direction) is larger than any of the thickness of the connector 11 and the outer diameter of the cable 10. Accordingly, in the display device 100 according to the first embodiment as illustrated in FIG. 3B, the cable 10 (including the connector 11) in the recess 113 can be connected to the interface portion 123 without protruding to the outer side (X-axis negative side) from the rear face of the thick portion 112.

As a result, the display device 100 according to the first embodiment can prevent a sudden load from being applied to the connector 11 of the cable 10 from the rear side of the thick portion 112.

As illustrated in FIG. 3A, the thick portion 112 includes an outlet 113B through which the cable 10 can be drawn out from the recess 113 to the upper side of the thick portion 112.

To be specific, the outlet 113B has a groove shape extending upward (in the Z-axis positive direction) from a corner on the upper right side (Z-axis positive side and Y-axis negative side) of the recess 113 and connecting to a space above the thick portion 112. The depth of the outlet 113B (in the X-axis direction) is the same as the depth of the recess 113 (in the X-axis direction).

As a result, in the display device 100 according to the first embodiment, the cable 10 can be drawn out from the recess 113 to the upper side of the thick portion 112 without protruding from the rear face of the thick portion 112 to the outside (X-axis negative side).

Further, as illustrated in FIG. 3A, the thick portion 112 includes a holder 114 to hold the cable 10 to the outlet 113B. To be specific, both end portions of the holder 114 in the left-right direction (Y-axis direction) can be fixed to the thick portion 112 by fitting in a state of straddling the outlet 113B in the left-right direction (Y-axis direction).

As a result, according to the display device 100 of the first embodiment, the cable 10 can be held at the outlet 113B by the holder 114 so that the cable 10 does not fall off from the outlet 113B. In addition, according to the display device 100 of the first embodiment, even in a case where a load such as being pulled by the cable 10 occurs, the load can be received by the holder 114. As a result, a risk of damaging the interface portion 123 can be reduced.

As illustrated in FIGS. 3A and 3B, the thick portion 112 has an upper face 112A and can guide an arrangement path of the cable 10 drawn out from the outlet 113B along the upper face 112A of the thick portion 112.

As a result, in the display device 100 according to the first embodiment, the cable 10 drawn out from the outlet 113B can be easily arranged on a predetermined arrangement path.

As illustrated in FIGS. 3A and 3B, the thick portion 112 has clamps 115 to hold the cable 10 whose arrangement path is guided by the upper face 112A of the thick portion 112.

As a result, the display device 100 according to the first embodiment can hold the cable 10 pulled out from the outlet 113B on the predetermined arrangement path.

In the example illustrated in FIG. 3A, the thick portion 112 includes two clamps 115 in each of the arrangement path of the cable 10 on the right side (Y-axis negative side) of the outlet 113B and the arrangement path of the cable 10 on the left side (Y-axis positive side) of the outlet 113B.

As a result, in the display device 100 according to the first embodiment, the cable 10 can be held on the arrangement path by the two clamps 115 in any of the case where the draw-out direction of the cable 10 from the outlet 113B is left (Y-axis positive direction) and the case where the draw-out direction of the cable 10 from the outlet 113B is right (Y-axis negative direction).

In the example illustrated in FIG. 3A, on the rear face of the thick portion 112, the interface portion 123 is disposed on the left side (Y-axis positive side) of the central portion in the left-right direction (Y-axis direction), while the outlet 113B is disposed in the central portion in the left-right direction (Y-axis direction).

Accordingly, in the display device 100 according to the first embodiment, the cable connected to the interface portion 123 can be easily bent and drawn out from the outlet 113B (i.e., the center portion in the left-right direction (Y-axis direction)) to the upper side of the thick portion 112.

In addition, in the display device 100 according to the first embodiment, the draw-out direction of the cable 10 from the outlet 113B can be set to any of the left direction (Y-axis positive direction) and the right direction (Y-axis negative direction).

As described above, in the display device 100 according to the first embodiment, the outlet 113B is disposed in the central portion in the right-left direction (Y-axis direction). As a result, the length of a portion of the cable 10 guided along the upper face of the thick portion 112 can be equal between the case where the draw-out direction of the cable 10 from the outlet 113B is left (Y-axis positive direction) and the case where the draw-out direction is right (Y-axis negative direction). In other words, the length of the portion of the cable 10 drawn out from the housing 110 to the outside can be equal. As a result, in the display device 100 according to the first embodiment, the required length of the cable 10 can be set to a constant length regardless of whether an external device to be connected to the display device 100 is arranged on the left side or the right side of the display device 100.

In the example illustrated in FIG. 3A, two interface portions 123 are disposed side by side in the up-down direction (Z-axis direction) on the wall 113A on the Y-axis positive side of the recess 113 of the thick portion 112. Accordingly, in the display device 100 according to the first embodiment, two cables 10 can be connected in the recess 113. As a result, two external devices can be connected to the display device 100 via the two cables 10. In the example illustrated in FIG. 3A, the outlet 113B has a horizontal width (in the right-left direction) larger than twice the outside diameter of the cable 10 such that the two cables 10 can be drawn out side by side.

As illustrated in FIG. 3A, the display device 100 according to the first embodiment includes a stand 136 in the thick portion 112. The stand 136 can be stored in the thick portion 112. As illustrated in FIG. 3A, the stand 136 includes rotation shafts 136X at an upper end portion of the stand 136, and the stand 136 is provided to be rotatable about the rotation shafts 136X.

The stand 136 has a rectangular frame shape (which can also be referred to as a U-shape). On the other hand, a storage groove 112B having the same shape as the stand 136 is formed in the thick portion 112. As a result, the display device 100 according to the first embodiment can store the stand 136 in the storage groove 112B in a manner such that the stand 136 does not protrude from the rear face of the thick portion 112.

As illustrated in FIGS. 1 and 2, in the display device 100 according to the first embodiment, the stand 136 is rotated from the stored state to the opened state, thus allowing the housing 110 to stand on an installation surface. The display device 100 according to the first embodiment can adjust the opening angle of the stand 136 to adjust the inclination of the housing 110 with respect to the installation surface.

The rotation shafts 136X of the stand 136 are disposed below the upper face 112A of the thick portion 112. Accordingly, in the display device 100 according to the first embodiment, the opening and closing operation of the stand 136 does not interfere with the cable 10 arranged along the upper face 112A of the thick portion 112.

Example of Storage of Cable 10

FIGS. 4A and 4B are a rear view and a side view, respectively, of the display device 100 when the display device is not used according to a first embodiment of the present disclosure.

As illustrated in FIG. 3A, in a case where the direction in which the cable 10 is drawn out from the outlet 113B is the right direction (Y-axis negative direction), the two clamps 115 provided on the right side (Y-axis negative side) of the outlet 113B hold the cable 10. However, the two clamps 115 provided on the left side (Y-axis positive side) of the outlet 113B are in a free state.

Then, as illustrated in FIG. 4A, in the display device 100 according to the first embodiment, the cable 10 is folded back in the vicinity of the end portion on the right side (Y-axis negative side) of the housing 110. Thus, the other end portion side of the cable 10 can be held by the clamps 115 provided on the left side (Y-axis positive side) of the outlet 113B.

As a result, as illustrated in FIG. 4A, when the display device 100 according to the first embodiment is not used (e.g., during transportation or storage), the display device 100 can hold the cable 10 and bring the cable 10 into the stored state without protruding the cable from the housing 110.

In the display device 100 according to the first embodiment, the connector 11 at the one end of the cable 10 is connected to the interface portion 123 without protruding from the recess 113 of the thick portion 112. Accordingly, a load is less likely to be applied to the connector 11 at the one end even when the display device 100 is not in use (e.g., during transportation or storage). As a result, the display device 100 according to the first embodiment can bring the cable 10 into the stored state, as illustrated in FIG. 4A, with the connector 11 at the one end being connected to the interface portion 123.

In the display device 100 according to the first embodiment, the difference between the thickness of the thick portion 112 and the thickness of the thin portion 111 is larger than the outer diameter of the cable 10. As a result, in the display device 100 according to the first embodiment, the portion of the cable 10 drawn out from the outlet 113B can be arranged on the rear face of the thin portion 111 on the upper side of the thick portion 112 such that the cable 10 does not protrude to the outer side (X-axis negative side) from the rear face of the thick portion 112.

Example of Internal Configuration of Display Device 100

FIG. 5 is a schematic view illustrating an example of an internal configuration of the display device 100 according to the first embodiment of the present disclosure.

As illustrated in FIG. 5, in the display device 100 according to the first embodiment, the outlet 113B is disposed in the center portion in the left-right direction (Y-axis direction). Accordingly, in the display device 100 according to the first embodiment, the length of a portion of the cable 10 guided along the upper face of the thick portion 112 can be half-length (e.g., W/2 in FIG. 5) of the horizontal width W of the housing 110 in any of the case where the draw-out direction of the cable 10 from the outlet 113B is left (Y-axis positive direction) and the case where the draw-out direction of the cable 10 from the outlet 113B is right (Y-axis negative direction).

As illustrated in FIG. 5, the display device 100 according to the first embodiment includes the control board 131, the operation board 132, and the battery 133 inside the thick portion 112.

The control board 131 is connected to the interface portion 123, and various electronic components are mounted on the control board 131 to construct a control circuit that controls the operation of the display device 100.

The operation board 132 is connected to a switch 134 and a switch 135 disposed on the left side (Y-axis positive side) of the thick portion 112, and various electronic components are mounted on the operation board 132 to construct a control circuit that controls the operations of the switch 134 and the switch 135. Note that the switch 134 and the switch 135 are, for example, a power button, a selection button, a confirmation button, and a return button.

The battery 133 stores electric power to drive the display device 100. Various rechargeable secondary batteries (for example, a lithium-ion battery and a lithium polymer battery) are used as the battery 133. The display device 100 can be supplied with power from an external device via the cable 10 and the interface portion 123 to charge the battery 133.

As illustrated in FIG. 5, in the display device 100 according to the first embodiment, the recess 113 is disposed substantially at the center of the thick portion 112 in the left-right direction (Y-axis direction). Accordingly, the control board 131 and the operation board 132 can be disposed in a space on the left side (Y-axis positive side) of the recess 113 in the thick portion 112, and the battery 133 can be disposed in a space on the right side (Y-axis negative side) of the recess 113 in the thick portion 112.

As a result, the display device 100 according to the first embodiment can effectively use the space of the thick portion 112 while the recess 113 is disposed in the thick portion 112.

Second Embodiment (Configuration of Display Device 100-2)

Figure 6:
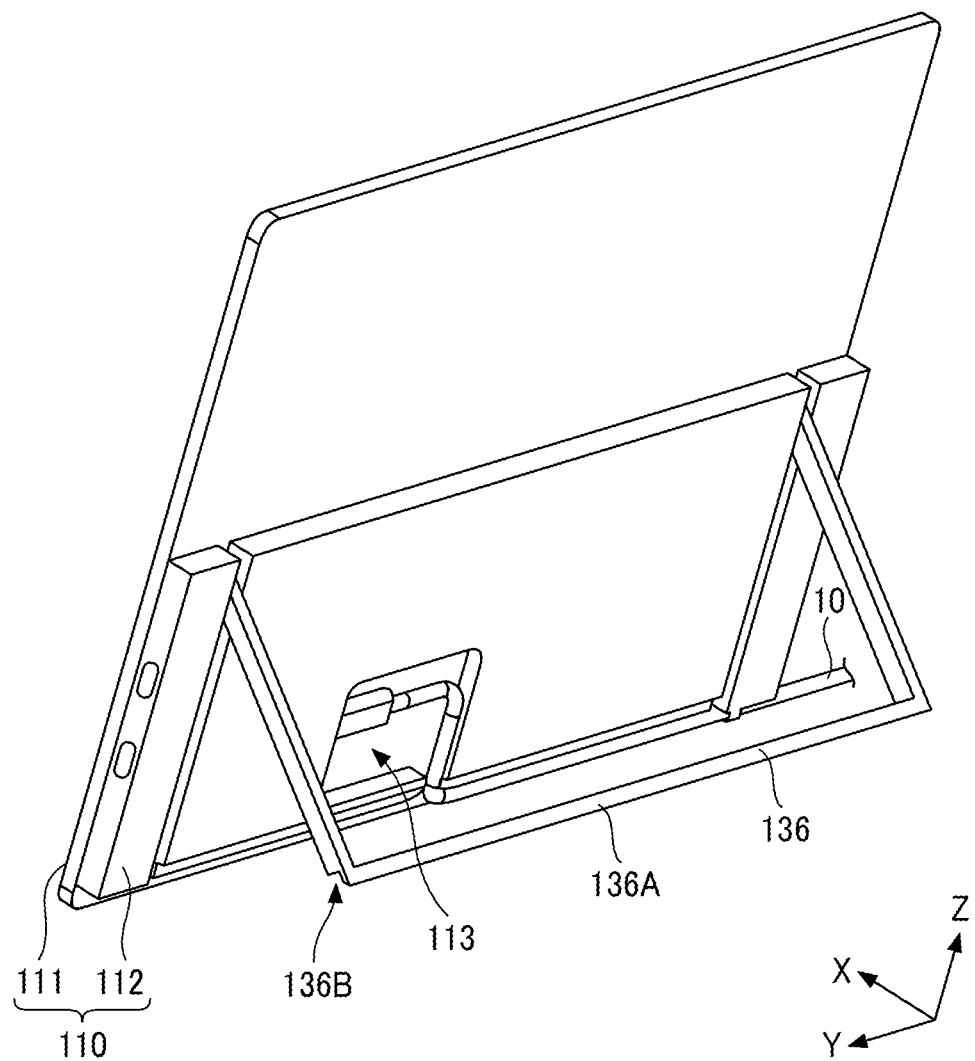
FIG. 6 is an external perspective view illustrating a rear side of the display device according to a second embodiment of the present disclosure.

FIG. 6 is an external perspective view illustrating a rear side of a display device 100-2 according to a second embodiment of the present disclosure. FIGS. 7A and 7B are a rear view and a side view, respectively, of the display device 100-2 according to the second embodiment of the present disclosure.

As illustrated in FIGS. 6, 7A, and 7B, in the display device 100-2 according to the second embodiment, the recess 113 is disposed on the rear face of the thick portion 112, similarly to the display device 100 according to the first embodiment. However, in the display device 100-2 according to the second embodiment, the outlet 113B is disposed in a corner portion on the lower right (Z-axis negative side and Y-axis negative side) of the recess 113.

As a result, in the display device 100-2 according to the second embodiment, the cable 10 can be drawn out from the recess 113 to the lower side of the thick portion 112 without protruding from the rear face of the thick portion 112 to the outside (X-axis negative side).

In the display device 100-2 according to the second embodiment, a lower face 112C of the thick portion 112 can guide the arrangement path of the cable 10 drawn out from the outlet 113B along the lower face 112C.

Furthermore, in the display device 100-2 according to the second embodiment, the cable 10 drawn out from the outlet 113B can be held on a predetermined arrangement path by the clamps 115 disposed on the arrangement path along the lower face 112C of the thick portion 112.

In the example illustrated in FIG. 7A, the thick portion 112 includes one clamp 115 in each of the arrangement path of the cable 10 on the right side (Y-axis negative side) of the outlet 113B and the arrangement path of the cable 10 on the left side (Y-axis positive side) of the outlet 113B.

As a result, in the display device 100-2 according to the second embodiment, the cable 10 can be held on the arrangement path by the one clamp 115 in any of the case where the draw-out direction of the cable 10 from the outlet 113B is left (Y-axis positive direction) and the case where the draw-out direction of the cable 10 from the outlet 113B is right (Y-axis negative direction).

In the display device 100-2 according to the second embodiment, the cable 10 can be drawn out to the outside of the housing 110 from the lower end portion of the side face of the housing 110.

In the display device 100-2 according to the second embodiment, in particular, the recess 113 is disposed in the vicinity of the lower end portion of the rear face of the thick portion 112. Thus, the distance from the interface portion 123 to the lower face 112C of the thick portion 112 (i.e., the required length of the cable 10) can be further shortened.

As illustrated in FIG. 6, in the display device 100-2 according to the second embodiment, when the stand 136 is stored, a lower frame 136A of the stand 136 covers the cable 10 whose arrangement path is guided by the lower face 112C of the thick portion 112.

In the display device 100-2 according to the second embodiment, the cutout 136B is formed at a position in the lower frame 136A of the stand 136 such that the cutout 136B overlays the cable 10 arranged along the lower frame 136A. Accordingly, the display device 100-2 according to the second embodiment can prevent the cable 10 from being pinched by the lower frame 136A of the stand 136 when the stand 136 is stored.

Third Embodiment (Configuration of Display Device 100-3)

Figure 8:
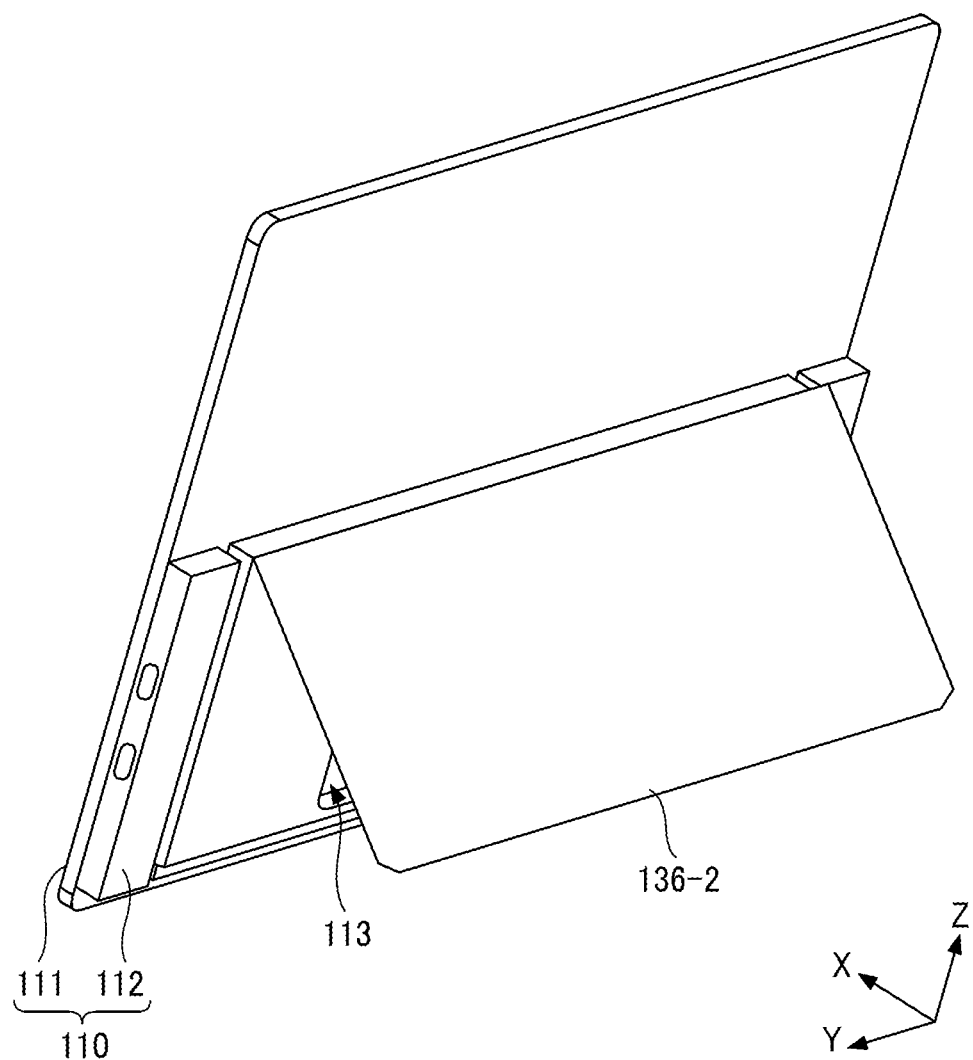
FIG. 8 is an external perspective view illustrating a rear side of the display device according to a third embodiment of the present disclosure.
Figure 9:
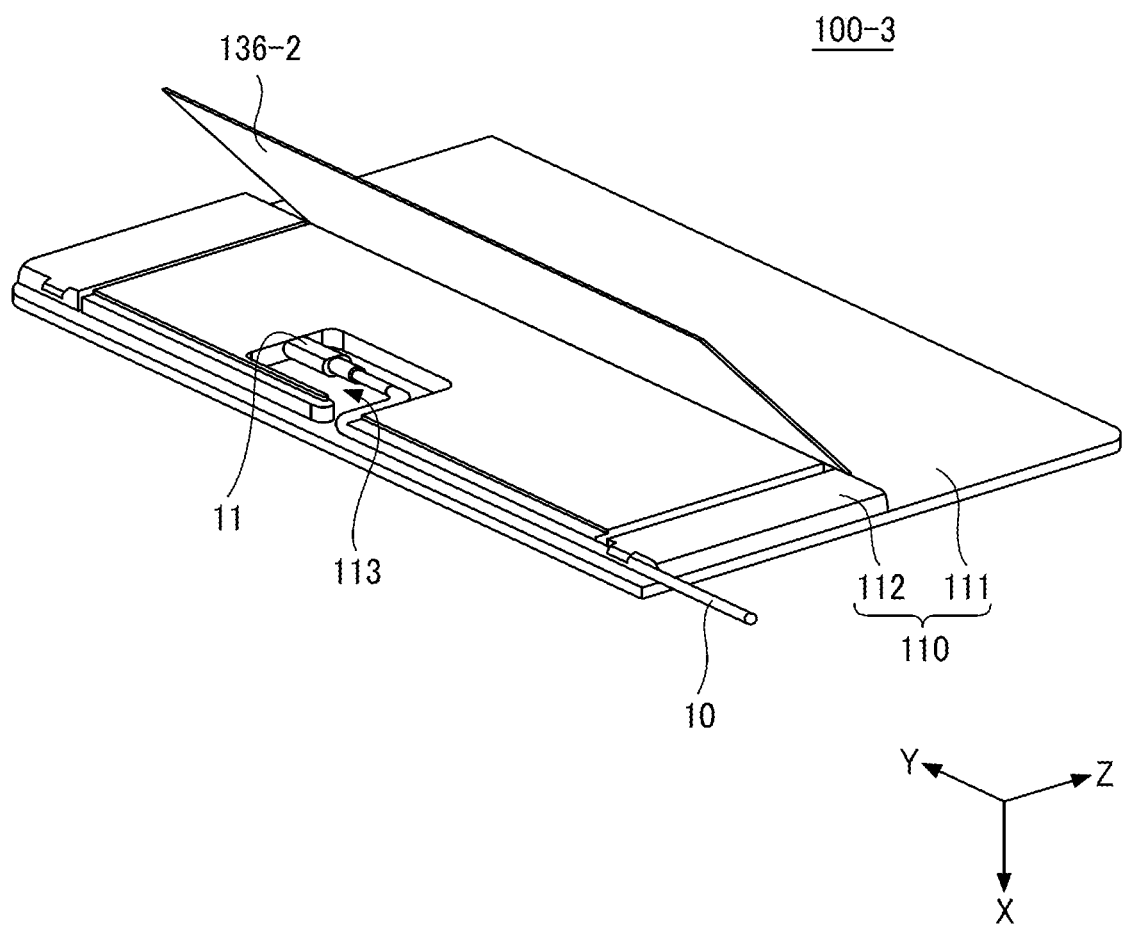
FIG. 9 is another external perspective view illustrating a rear side of the display device according to the third embodiment of the present disclosure.

FIGS. 8 and 9 are external perspective views illustrating a rear side of a display device 100-3 according to a third embodiment of the present disclosure. FIGS. 10A and 10B are a rear view and a side view, respectively, of the display device 100-3 according to the third embodiment of the present disclosure.

As illustrated in FIGS. 8, 9, 10A, and 10B, the display device 100-3 according to the third embodiment is different from the display device 100-2 according to the second embodiment in that a stand 136-2 having a rectangular plate shape is provided instead of the stand 136 having a rectangular frame shape. The stand 136-2 overlays the rear face of the thick portion 112 and covers the recess 113 when the stand 136-2 is stored. The stand 136-2 also covers the cable 10 arranged along the lower face 112C of the thick portion 112 when the stand 136-2 is stored. As a result, in the display device 100-3 according to the third embodiment, the recess 113 and the cable 10 can be covered and hidden by the stand 136-2 when the stand 136-2 is stored, and thus the design of the rear face of the housing 110 can be improved.

Example of Modification of Holder 114

FIGS. 11A and 11B are perspective views illustrating a modification of the holder 114 included in the display device 100 according to an embodiment of the present disclosure. In the example illustrated in FIG. 11, the display device 100 according to the present embodiment includes a holder 114-2 instead of the holder 114.

The holder 114-2 is integrally molded with the thick portion 112 of the housing 110. As illustrated in FIG. 11, the holder 114-2 forms a narrow opening portion 114A at the entrance of the outlet 113B to partially narrow the entrance of the outlet 113B.

The narrow opening portion 114A is slightly smaller than the outer diameter of the cable 10. Accordingly, in the example illustrated in FIG. 11, the cable 10 can be pushed into the narrow opening portion 114A to arrange the cable 10 in the outlet 113B.

As a result, according to the display device 100 of the present embodiment, the cable can be held at the outlet 113B by the holder 114-2 so that the cable 10 does not fall off from the outlet 113B. In addition, according to the display device 100 of the present embodiment, even in a case where a load such as being pulled by the cable 10 occurs, the load can be received by the holder 114-2. As a result, a risk of damaging the interface portion 123 can be reduced.

In the display device 100 according to the present embodiment, since the holder 114-2 is integrally molded with the thick portion 112 of the housing 110, the number of components can be reduced compared to a configuration in which the holder 114 is provided.

First Modification of Configuration of Rear Face of Display Device 100

FIGS. 12A, 12B, and 12C are perspective views illustrating a first modification of the configuration of the rear side of the display device 100 according to an embodiment of the present disclosure.

In a display device 100-4 illustrated in FIG. 12, the overall rear face of a housing 110 is a thick portion 112. In the display device 100-4, a recess 113 is provided in a central portion of the rear face of the thick portion 112, in other words, in the central portion of the rear face of the housing 110.

The display device 100-4 further includes a pair of left and right outlets 113B on the rear face of the thick portion 112. Each of the left and right outlets 113B has a groove shape linearly extending from the center of the recess 113 in the up-down direction to the end of the thick portion 112 in the left-right direction.

Accordingly, in the display device 100-4, a cable 10 can be drawn out from the recess 113 in any of the left direction and right direction. In the display device 100-4, the cable 10 can be linearly arranged along the outlet 113B and drawn out to the outside of the housing from the recess 113.

In the display device 100-4, stands 136-3 and storage portions 112D are disposed at four corners on the rear face of the thick portion 112.

The stand 136-3 and the storage portion 112D have a vertically long rectangular shape and have the same shape. The stand 136-3 is rotatable about a rotation shaft disposed in the vicinity of the outer short side of the rectangular shape in the vertical direction. The stand 136-3 can be stored in the storage portion 112D in a manner such that the stand 136 does not protrude from the rear face of the thick portion 112.

As illustrated in FIG. 12A, the two stands 136-3 on the lower side can be opened so that the display device 100-4 is horizontally installed on an installation surface in a state of being substantially perpendicular to the installation surface.

As illustrated in FIG. 12B, the two stands 136-3 on the upper side can be opened so that the display device 100-4 is horizontally installed on the installation surface in a state of being substantially horizontal to the installation surface.

As illustrated in FIG. 12C, the two stands 136-3 on the right side can be opened so that the display device 100-4 is vertically installed on the installation surface in a state of being substantially perpendicular to the installation surface.

Note that the stand 136-3 is configured to rotate with a certain load applied to the stand 136-3. As a result, the stand 136-3 can maintain the opening angle in a state where the stand 136-3 is opened at any opening angle unless an external force is applied to the stand 136-3.

Second Modification of Configuration of Rear Face of Display Device 100

FIGS. 13A, 13B, and 13C are perspective views illustrating a second modification of the configuration of the rear side of the display device 100 according to an embodiment of the present disclosure.

A display device 100-5 illustrated in FIGS. 13A, 13B, and 13C is different from the display device 100-4 illustrated in FIG. 12 in that each of a pair of left and right outlets 113B includes a holder 114.

Accordingly, in the display device 100-5 illustrated in FIG. 13, a cable 10 arranged in the outlet 113B can be held by the holder 114 so that the cable 10 does not easily fall off from the outlet 113B.

In the display devices 100-5 and 100-4, the two cables 10 are connected in the recess 113, and the two cables 10 can be collectively drawn out from the recess 113 to the left outside or right outside of the housing 110 via the left outlet 113B or right outlet 113B (see FIGS. 13A and 13B).

In the display devices 100-5 and 100-4, one cable 10 is connected in the recess 113, and the one cable 10 can be drawn out from the recess 113 to the left or right outside of the housing 110 via the left outlet 113B or right outlet 113B (see FIGS. 12A and 12B).

In the display devices 100-5 and 100-4, two cables 10 are connected in the recess 113, one cable 10 can be drawn out to the left outside of the housing 110 via the left outlet 113B, and the other cable 10 can be drawn out to the right outside of the housing 110 via the right outlet 113B.

In the display devices 100-5 and 100-4, since the outlet 113B is disposed between the pair of upper and lower storage portions 112D, the cable 10 arranged in the outlet 113B does not interfere with the opening and closing operations of the stands 136-3.

Third Modification of Configuration of Rear Face of Display Device 100

FIGS. 14A, 14B, and 14C are perspective views illustrating a third modification of the configuration of the rear side of the display device 100 according to an embodiment of the present disclosure.

A display device 100-6 illustrated in FIGS. 14A, 14B, and 14C is different from the display device 100-4 illustrated in FIGS. 12A, 12B, and 12C, and the display device 100-5 illustrated in FIGS. 13A, 13B, and 13C in that thick portions 112 are partially disposed in the rear face of a housing 110.

To be specific, in the display device 100-6, the thick portions 112 are disposed at four corners (portions where stands 136-3 are provided), a central portion (a portion where the recess 113 is provided), and a portion below the central portion (a portion where an outlet 113B is provided) on the rear face of the housing 110.

The display device 100-6 illustrated in FIGS. 14A, 14B, and 14C is different from the display device 100-4 illustrated in FIGS. 12A, 12B, and 12C and the display device 100-5 illustrated in FIGS. 13A, 13B, and 13C in that each of the stands 136-3 and the storage portions 112D has a horizontally long rectangular shape.

The display device 100-6 illustrated in FIGS. 14A, 14B, and 14C is different from the display device 100-4 illustrated in FIGS. 12A, 12B, and 12C and the display device 100-5 illustrated in FIGS. 13A, 13B, and 13C in that the display device 100-6 includes one outlet 113B linearly extending from the center of the recess 113 in the left-right direction to the lower end portion of the thick portion 112.

Figure 15:
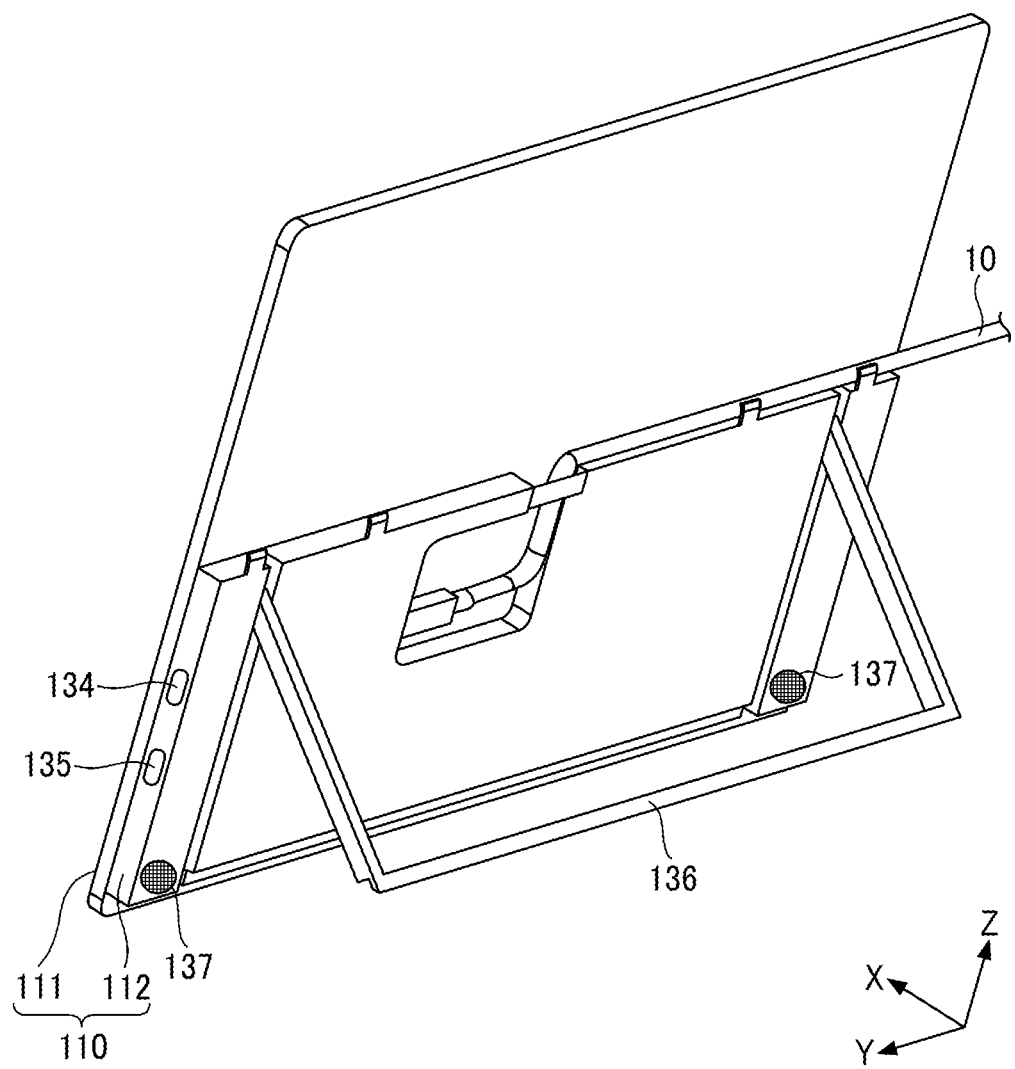
FIG. 15 is an external perspective view illustrating a rear side of the display device according to a fourth embodiment of the present disclosure.
Figure 16:
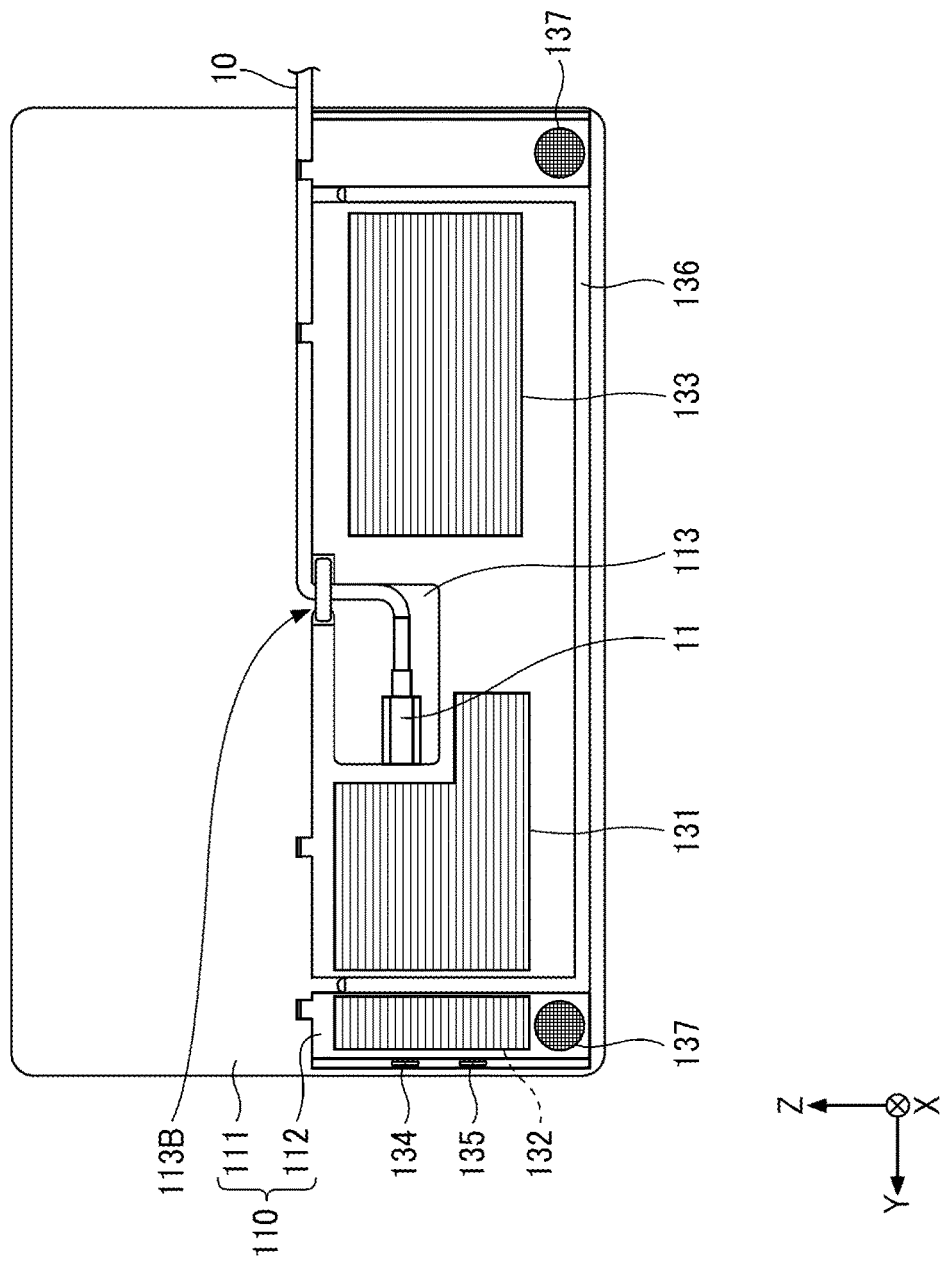
FIG. 16 is a view illustrating an internal configuration of the display device according to the fourth embodiment of the present disclosure.

Fourth Embodiment FIG. 15 is an external perspective view illustrating a rear side of a display device 100-7 according to a fourth embodiment of the present disclosure. FIG. 16 is a rear view illustrating an internal configuration of the display device 100-7 according to the fourth embodiment of the present disclosure.

As illustrated in FIGS. 15 and 16, the display device 100-7 according to the fourth embodiment is different from the display device 100 according to the first embodiment in that a pair of left and right speakers 137 are further provided on the rear face of a thick portion 112 of a housing 110. Accordingly, the display device 100-7 can output various stereo audio from the pair of speakers 137.

In particular, the pair of speakers 137 are disposed outside a U-shaped stand 136 in the left-right direction (Y-axis direction) on the rear face of the thick portion 112.

Accordingly, in the display device 100-7 according to the fourth embodiment, the pair of speakers 137 can be disposed at both left and right end portions on the rear face of the thick portion 112 such that the left speaker 137 and the right speaker 137 are most distant from each other in the left-right direction (Y-axis direction). Thus, the pair of speakers 137 can implement stereo sound output with a high stereo effect while including the thin and U-shaped stand 136.

As illustrated in FIGS. 15 and 16, in the display device 100-7 according to the fourth embodiment, a control board 131 and a battery 133 are disposed on the inner side of the stand 136 in the thick portion 112, and an operation board 132 is disposed on the left outer side (Y-axis positive side) of the stand 136 in the thick portion 112, similarly to the display device 100 according to the first embodiment.

The above-described configuration allows the display device 100-7 according to the fourth embodiment to include a switch 134 and a switch 135 on the left side (Y-axis positive side) of the thick portion 112 while including the thin and U-shaped stand 136.

As a result, the display device 100-7 according to the fourth embodiment allows a user to easily operate the switch 134 and the switch 135 even when the stand 136 is closed.

In the display device 100-7 according to the fourth embodiment, the switch 134 and the switch 135 are disposed on the upper side (Z-axis positive side) of the speakers 137.

Accordingly, when the display device 100-7 according to the fourth embodiment is installed on the installation surface in the standing state as illustrated in FIG. 15, the user can easily operate from the front side (the X-axis positive side) with the index finger of the right hand of the user. When the side face of the little finger of the right hand of the user is placed on the installation surface, the index finger is positioned at a height position away from the installation surface to a certain extent.

In the display device 100-7 according to the fourth embodiment, the battery 133 is disposed on the inner side of the stand 136 in the thick portion 112. Accordingly, a sufficient space for the battery 133 can be obtained, thus, allowing a larger size of the battery 133 to be mounted in the display device 100-7.

Figure 17:
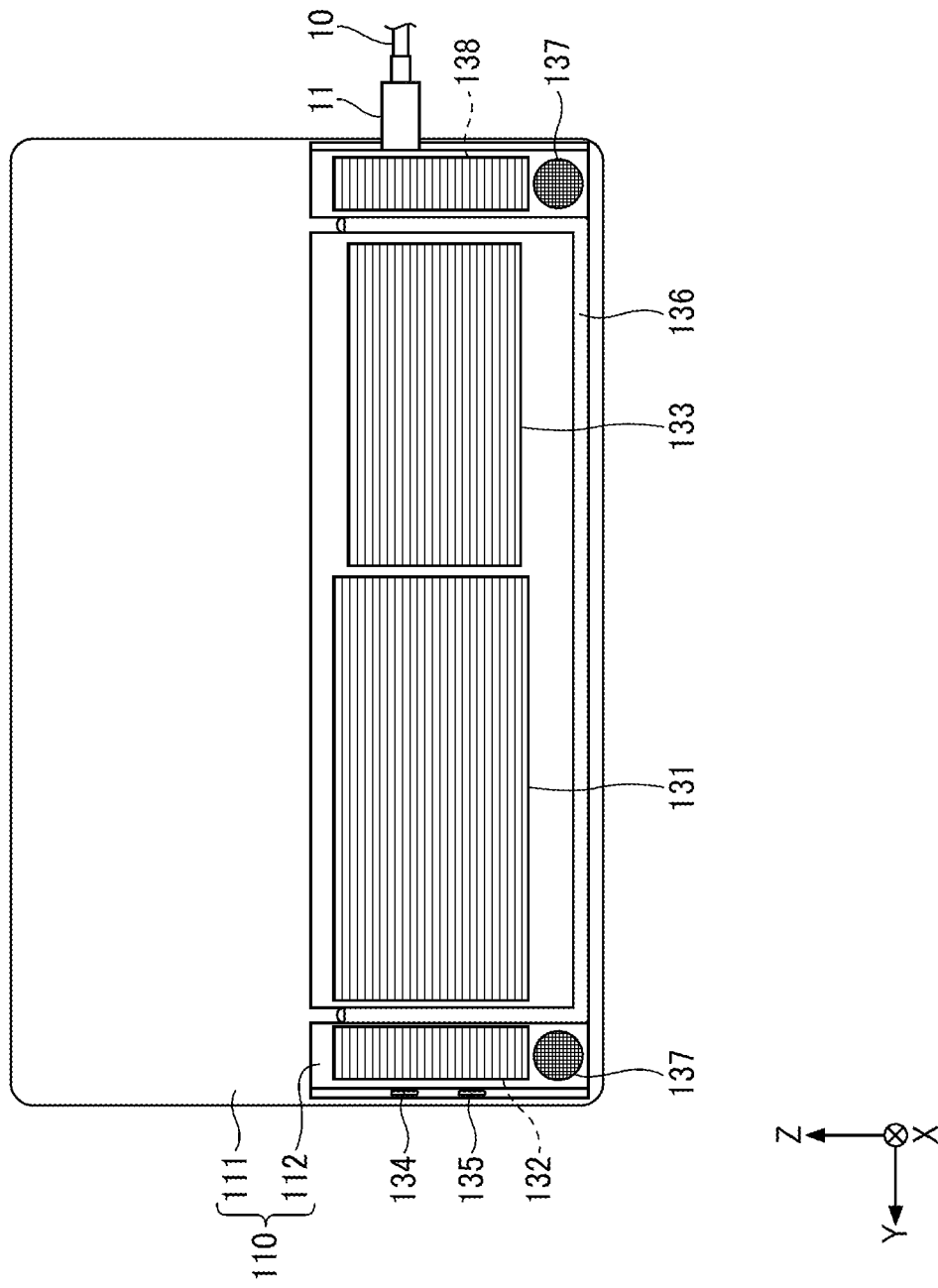
FIG. 17 is a view illustrating an internal configuration of the display device according to a fifth embodiment of the present disclosure.

Fifth Embodiment FIG. 17 is a rear view illustrating an internal configuration of a display device 100-8 according to a fifth embodiment of the present disclosure. As illustrated in FIG. 17, the display device 100-8 according to the fifth embodiment is different from the display device 100-7 according to the fourth embodiment in that an interface portion 123 is not disposed in a central portion of a rear face of a thick portion 112, and instead, an interface board 138 is disposed on the right outer side (Y-axis negative side) of a stand 136 in the thick portion 112.

Due to such a configuration, in the display device 100-8 according to the fifth embodiment, the interface portion 123 is disposed on the right side (Y-axis negative side) of the thick portion 112.

Accordingly, in the display device 100-8 according to the fifth embodiment, as illustrated in FIG. 17, a connector 11 at one end portion of a cable 10 can be easily attached to and detached from the interface portion 123 even in a state where the stand 136 is closed. In addition, in the display device 100-8 according to the fifth embodiment, a wider region on the inner side of the stand 136 in the thick portion 112 can be obtained.

In particular, in the display device 100-8 according to the fifth embodiment, the interface portion 123 is disposed on the upper side (Z-axis positive side) of the speaker 137.

Accordingly, when the display device 100-8 according to the fifth embodiment is installed on the installation surface in the standing state, the connector 11 at one end portion of the cable 10 can be easily attached to and detached from the interface portion 123.

Although some embodiments of the invention have been described in detail above, the present disclosure is not limited to such specific embodiments, and various modifications and changes can be made within the scope of the gist of the invention described in the claims.

Aspects of the present disclosure are, for example, as follows.

Aspect 1

A display device includes a thin portion, a thick portion, and an interface portion. The thin portion includes a display. The thick portion is provided such that the thick portion protrudes backward from a rear face of the thin portion. The interface portion is connected to a connector of a cable to connect an external device. The thick portion includes a recess. The interface portion is disposed in the recess of the thick portion.

Aspect 2

In the display device described in Aspect 1, the interface portion is disposed such that the connector protrudes in the recess when the connector is connected to the interface portion.

Aspect 3

In the display device described in Aspect 1 or Aspect 2, the recess includes a plurality of walls extending in a thickness direction of the thick portion and a bottom parallel to a direction intersecting the plurality of walls. The interface portion is disposed in the plurality of walls.

Aspect 4

In the display device described in Aspect 2, the interface portion is connectable to the cable in the recess without causing the cable to protrude to an outer side from a rear face of the thick portion.

Aspect 5

In the display device described in any one of Aspects 1 to 4, the thick portion includes an outlet through which the cable is drawable out from the recess.

Aspect 6

In the display device described in Aspect 5, the cable is drawable out from the recess through the outlet to an upper side of the thick portion.

Aspect 7

In the display device described in Aspect 5 or Aspect 6, the recess includes the plurality of walls extending in the thickness direction of the thick portion and the bottom parallel to the direction intersecting the plurality of walls. The outlet is disposed in the plurality of walls.

Aspect 8

In the display device described in any one of Aspects 5 to 7, the outlet is disposed at a center portion in a width direction of the display device and on a rear face of the thick portion.

Aspect 9

In the display device described in any one of Aspects 5 to 8, the thick portion includes a holder to hold the cable at the outlet.

Aspect 10

In the display device described in any one of Aspects 5 to 9, the thick portion has an upper face to guide an arrangement path of the cable drawn out from the outlet along the upper face of the thick portion.

Aspect 11

In the display device described in Aspect 10, the thick portion has a clamp to hold the cable whose arrangement path is guided by the upper face of the thick portion.

Aspect 12

In the display device described in Aspect 10 or Aspect 11, the display device includes a stand. The stand includes a rotation shaft. The rotation shaft is disposed below the upper face of the thick portion.

Aspect 13

In the display device described in Aspect 5, the cable is drawable out from the recess through the outlet to a lower side of the thick portion.

Aspect 14

In the display device described in Aspect 13, the outlet is disposed at a center portion in a width direction of the display device and on a rear face of the thick portion.

Aspect 15

In the display device described in Aspect 13 or Aspect 14, the thick portion has a lower face to guide an arrangement path of the cable drawn out from the outlet along the lower face of the thick portion.

Aspect 16

In the display device described in Aspect 15, the thick portion has a clamp to hold the cable whose arrangement path is guided by the lower face of the thick portion.

Aspect 17

In the display device described in Aspect 15 or Aspect 16, the display device includes a stand. The stand has a rectangular frame shape. When the stand is stored, the stand covers the cable whose arrangement path is guided by the lower face of the thick portion.

Aspect 18

In the display device described in any one of Aspects 13 to 16, the display device includes a stand. The stand has a plate shape. The stand overlays a rear face of the thick portion and covers the recess when the stand is stored.

Aspect 19

In the display device described in any one of Aspects 1 to 18, a difference between a thickness of the thick portion and a thickness of the thin portion is larger than an outer diameter of the cable.

Aspect 20

In the display device described in any one of Aspects 1 to 19, the recess is disposed between a control board and a battery in the thick portion in a width direction of the display device.

Aspect 21

In the display device described in any one of Aspects 1 to 20, the display device includes a touch sensor overlaid on the display.

Aspect 22

In the display device described in any one of Aspects 1 to 11, 13 to 16, and 19 to 21, the display device includes a stand having a U-shape in a rear face of the thick portion and an operation board disposed outside the stand in the thick portion.

Aspect 23

In the display device described in Aspect 22, the display device includes a pair of left and right speakers outside the stand in the thick portion.

Aspect 24

In the display device described in Aspect 23, the operation board is disposed at a position higher than the pair of left and right speakers.

Aspect 25

In the display device described in any one of Aspects 22 to 24, the battery is disposed on the inner side of the stand in the thick portion.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

What is claimed is:

1. A display device comprising:
a thin portion including a display;
a thick portion disposed on a rear face of the thin portion thicker than the thin portion, the thick portion including a recess and an outlet through which a cable is drawable out from the recess to an upper side of the thick portion; and
an interface portion to connect to a connector of the cable for connection with an external device, the interface portion disposed in the recess of the thick portion, wherein
the recess includes a plurality of walls and a bottom, the plurality of walls extending in a thickness direction of the thick portion, the bottom being parallel to a direction intersecting the plurality of walls,
the outlet is disposed in at least one of the plurality of walls of the recess, and disposed at a center portion in a longitudinal direction of the display device on a rear face of the thick portion, and
the thick portion has an elongated portion defined by an upper face of the thick portion and one of the plurality of walls of the recess, the elongated portion extending in the longitudinal direction of the display device, the outlet being disposed in the elongated portion.

2. The display device according to claim 1,
wherein the interface portion is disposed in the recess such that the connector protrudes in the recess when the connector is connected to the interface portion.

3. The display device according to claim 2,
wherein the interface portion is connectable to the cable without causing the cable in the recess to protrude to an outer side from a rear face of the thick portion.

4. The display device according to claim 1,
wherein the interface portion is disposed in at least one of the plurality of walls.

5. The display device according to claim 1,
wherein the thick portion includes a holder to hold the cable at the outlet.

6. The display device according to claim 1, wherein the thick portion has the upper face to guide the cable drawn out from the outlet along the upper face of the thick portion.

7. The display device according to claim 6,
wherein the thick portion has a clamp to hold the cable guided by the upper face of the thick portion.

8. The display device according to claim 6, further comprising
a stand including a rotation shaft, and
wherein the rotation shaft is disposed below the upper face of the thick portion.

9. The display device according to claim 8, wherein the stand has a rectangular frame shape.

10. The display device according to claim 1, wherein a difference between a thickness of the thick portion and a thickness of the thin portion is larger than an outer diameter of the cable.

11. The display device according to claim 1, further comprising:
a control board; and
a battery,
wherein the recess is disposed between the control board and the battery in the thick portion in a width direction of the display device.

12. The display device according to claim 1, further comprising a touch sensor overlaid on the display.

13. The display device according to claim 1, further comprising:
a stand having a U-shape in a rear face of the thick portion;
an operation board disposed outside the stand in the thick portion;
a pair of left and right speakers outside the stand in the thick portion; and
a battery disposed on an inner side of the stand in the thick portion,
wherein the operation board is disposed at a position higher than the pair of left and right speakers.

14. The display device according to claim 1, wherein the plurality of walls of the recess include a first wall and a second wall facing the first wall, the interface portion is disposed in the first wall, the cable is placed in a contact condition with the second wall, and guided along the second wall to the outlet where the cable is drawn out above the second wall, the thick portion includes a holder that holds the cable in the contact condition at the outlet, and the cable drawn out from the outlet is guided along the upper face of the thick portion.

* * * * *